United States Patent
Suzuki

(10) Patent No.: US 8,092,231 B2
(45) Date of Patent: Jan. 10, 2012

(54) SOCKET FOR ELECTRIC COMPONENT

(75) Inventor: Satoru Suzuki, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 12/892,080

(22) Filed: Sep. 28, 2010

(65) Prior Publication Data
US 2011/0212641 A1    Sep. 1, 2011

(30) Foreign Application Priority Data

Sep. 28, 2009 (JP) .................. 2009-222627

(51) Int. Cl.
*H01R 12/00* (2006.01)

(52) U.S. Cl. ........................................ 439/70

(58) Field of Classification Search .............. 439/70, 439/71, 72, 73, 330, 331
See application file for complete search history.

(56) References Cited

U.S. PATENT DOCUMENTS

| | | | |
|---|---|---|---|
| 5,700,155 A * | 12/1997 | Matsuoka | 439/266 |
| 6,261,114 B1 * | 7/2001 | Shimada | 439/266 |
| 6,426,553 B2 * | 7/2002 | Inomata | 257/727 |
| 6,500,017 B2 * | 12/2002 | Hayakawa | 439/268 |
| 7,121,858 B2 * | 10/2006 | Chen | 439/259 |
| 7,658,620 B2 * | 2/2010 | Hsiao et al. | 439/71 |
| 7,857,646 B2 * | 12/2010 | Stutzman et al. | 439/266 |
| 7,866,987 B2 * | 1/2011 | Chen | 439/73 |
| 2003/0045148 A1 * | 3/2003 | Watanabe | 439/266 |

FOREIGN PATENT DOCUMENTS

JP    2909068 B    6/1999

* cited by examiner

*Primary Examiner* — Tulsidas C Patel
*Assistant Examiner* — Phuongchi Nguyen
(74) *Attorney, Agent, or Firm* — Kubotera & Associates, LLC

(57) ABSTRACT

A socket for an electric component provided with a plurality of contact pins in a socket body. The contact pin each have a lower contact part that is electrically conductive with a contact point on a substrate, an upper contact part that contacts the terminal of the electric component when pressure is applied, and an upper spring part that is located between the lower contact part and the upper contact part, that is elastically deformed when pressure is applied, and that, by its elasticity, presses the upper contact part against the terminal. The contact pins are each formed in such a shape that the location of the contact point with respect to the terminal does not change when pressure is applied and the upper contact part is rotated about the contact point (contact projection) of the upper contact part and the terminal.

4 Claims, 16 Drawing Sheets

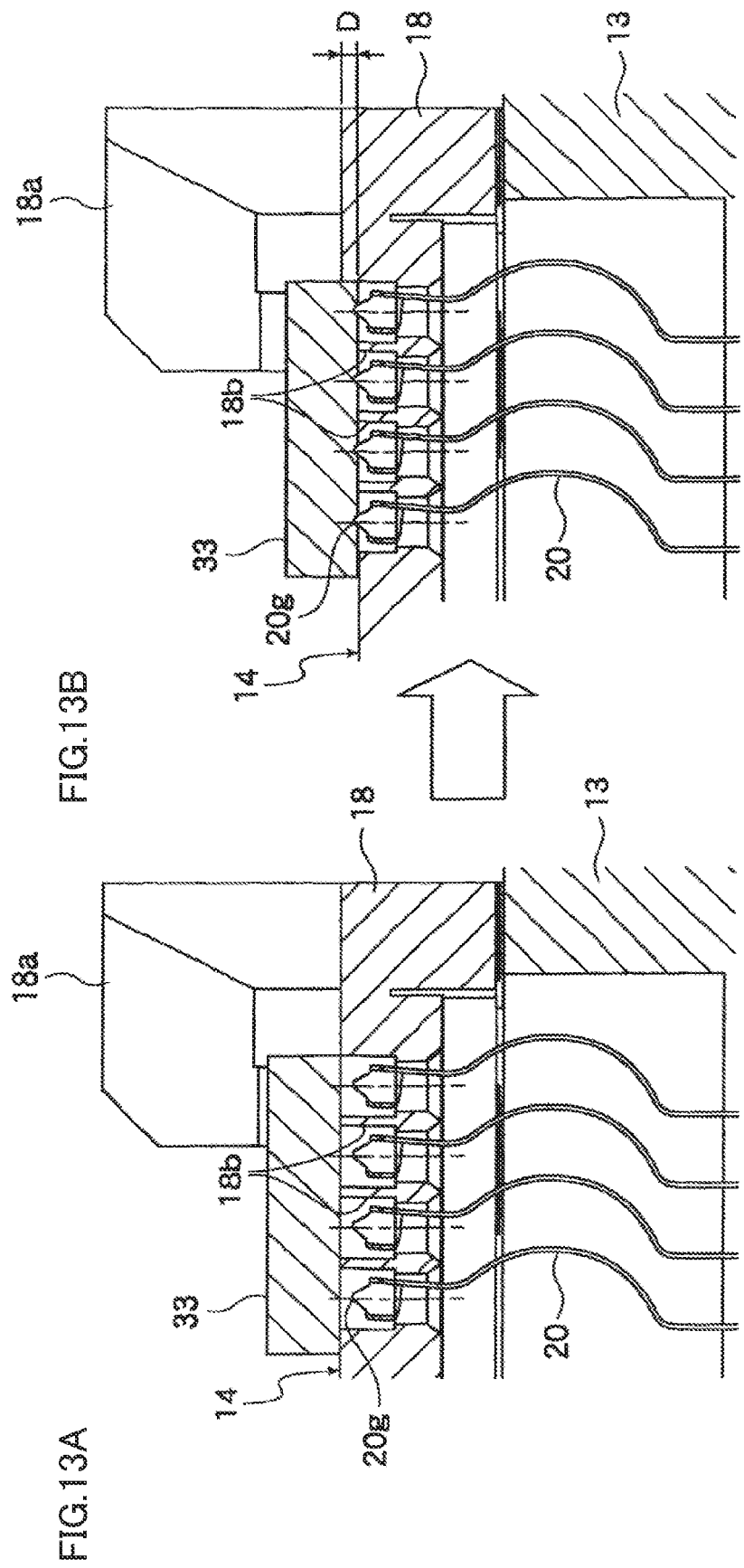

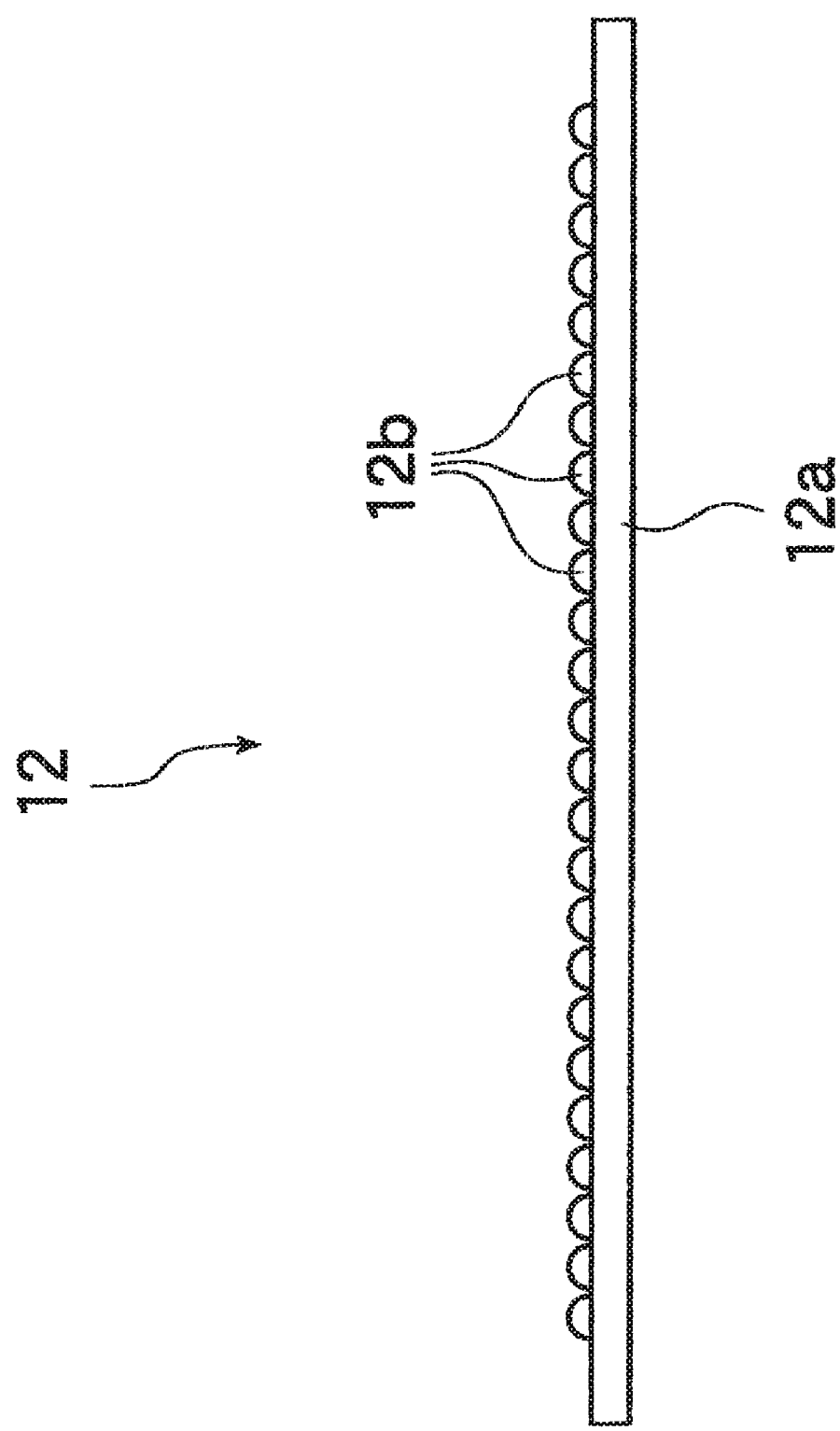

SOCKET FOR ELECTRIC COMPONENT

CROSS REFERENCE TO RELATED APPLICATIONS

The disclosure of Japanese Patent Application No.2009-222627, filed on Sep. 28, 2009, including the specification, drawings and abstract, is incorporated herein by reference in its entirety.

TECHNICAL FIELD

The present invention relates to an electric component socket for conducting a performance test by holding an electronic component such as an IC package removably.

BACKGROUND ART

As disclosed in patent literature 1, an IC socket for conducting a performance test such as a burn-in test for an IC package has been known heretofore as an electric component socket of this kind.

This IC socket has contact pins that each contact a spherical terminal of an electronic component such as an IC package. These contact pins each have a curved-spring part in its intermediate portion. A contact piece is provided in the upper end of each contact pin, and a round or groove-shaped concave area is formed in the inner surface of this contact piece.

Upon a test of an electric component, a terminal of the electric component is pressed against the contact piece in the upper end of each contact pin from above, so that the contact pin is compressed and the contact piece presses against a terminal of the electric component by the elasticity of the curved-spring part. Upon this press, the edge portion of the concave area formed in the inner surface of each contact piece touches a terminal of the electric component, thus maintaining the area of the contact piece small, allowing a plurality of points to contact the terminal, and improving the electrical conductivity.

CITATION LIST

Patent Literature

[PTL 1] Japanese Patent No. 2909068 Publication

SUMMARY OF INVENTION

Technical Problem

However, with an electric component socket providing a curved-spring part in an intermediate portion of each contact pin, when a contact piece provided in the upper end of the contact piece is pressed against a terminal of the electric component, the contact piece slips on the surface of the terminal having a spherical shape, exhibiting the phenomenon referred to as "wiping." This results in a problem where solder that forms the terminal of the electric component adheres to the contact point of the contact pin, accumulates, and consequently increases the electrical resistance value.

It is therefore an object of the present invention to provide an electrical component socket that prevents wiping when a contact piece formed in the upper end of a contact pin is pressed against a terminal of an electric component and prevent solder from adhering to the contact point by a simple configuration.

Solution to Problem

Features of the electric component socket of the present invention include proving: a socket body having an accommodating part that accommodates the electric component; a pressing member that presses the electric component accommodated in the accommodating part toward a substrate when the socket body is mounted on the substrate; and a plurality of contact pins that are incorporated inside the socket body and that make the electric component electrically conduct with the substrate when the pressing member presses the electric component, and, in this electric component socket, the contact pins each comprise: a lower contact part that is electrically conductive with a contact point of the substrate; an upper contact part that contacts an upper terminal of the electric component upon the press; and a curved-spring part that is located between the lower contact part and the upper contact part, that is elastically deformed upon the press, and that, by its elasticity, presses the upper contact part against the terminal of the electric component; and the contact pins are each formed in such a shape that, upon the press, after the upper contact part starts contacting the terminal of the electric component, an upper contact part side rotates about a contact point of the upper contact part with a terminal of the electric component, until the press is finished, and a location of the contact point with the terminal of the electric component does not change.

Advantageous Effects of Invention

According to the present invention, when a pressing member gives a press, an upper contact part of a contact pin starts contacting a terminal of the electric component, the location of the contact point between the upper contact part and the electric component does not change until the pressing member finishes pressing, so that it is possible to prevent wiping and prevent solder from adhering to the contact point.

BRIEF DESCRIPTION OF DRAWINGS

FIG. 13(a) shows embodiment 1 of the present invention and FIG. 13(b) shows another embodiment of the present invention, presenting vertical cross-sectional views showing the positional relationships between contact pins and a floating plate;

FIG. 14(a) shows a state where pressure is applied and FIG. 14(b) shows a state where pressure is not applied;

FIG. 16 is a side view of showing an IC package from the XVI arrow view in FIG. 15.

DESCRIPTION OF EMBODIMENTS

Embodiment 1

Now, embodiments of the present invention will be described below.

Figure 15:
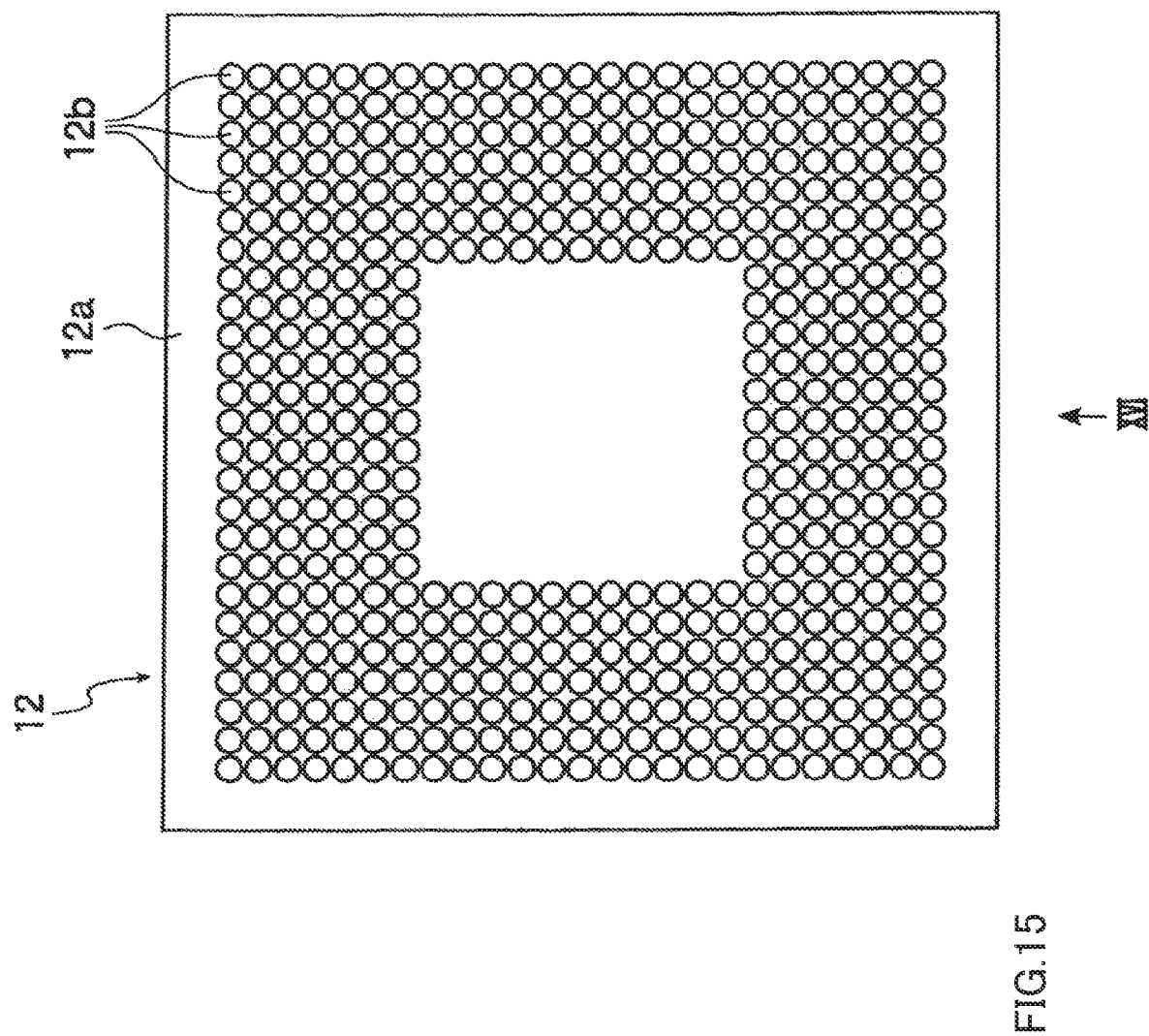
FIG. 15 is a bottom view of an IC package.

First, the configuration of an IC socket according to the present invention will be described. In order to conduct a performance test of IC package 12 that serves as an "electric component" (FIG. 15 and FIG. 16), IC socket 11 that serves as an "electric component socket" electrically connects a terminal of this IC package 12, and printed wiring board (substrate: see FIG. 2) of a measurement instrument (tester).

This IC package 12 is a BGA (Ball Grid Array) type, in which many solder balls 12b, which are made from solder, have a hemi-spherical shape and serve as a terminal, are disposed in a matrix form, in the bottom surface of substantially square package body 12a. IC package 12 may also be an LGA (Land Grid Array) type, in which, instead of solder balls, flat electrode pads are arranged in a lattice form.

As shown in FIG. 1 to FIG. 5, IC socket 11 has plastic socket body 13 that is mounted on printed wiring board 10. IC package 12 is accommodated in accommodating part 14 formed on socket body 13. In socket body 13, operating member 15 is provided to be movable upward and downward, and a pair of pressing members 16 are provided rotatably.

Figure 5:
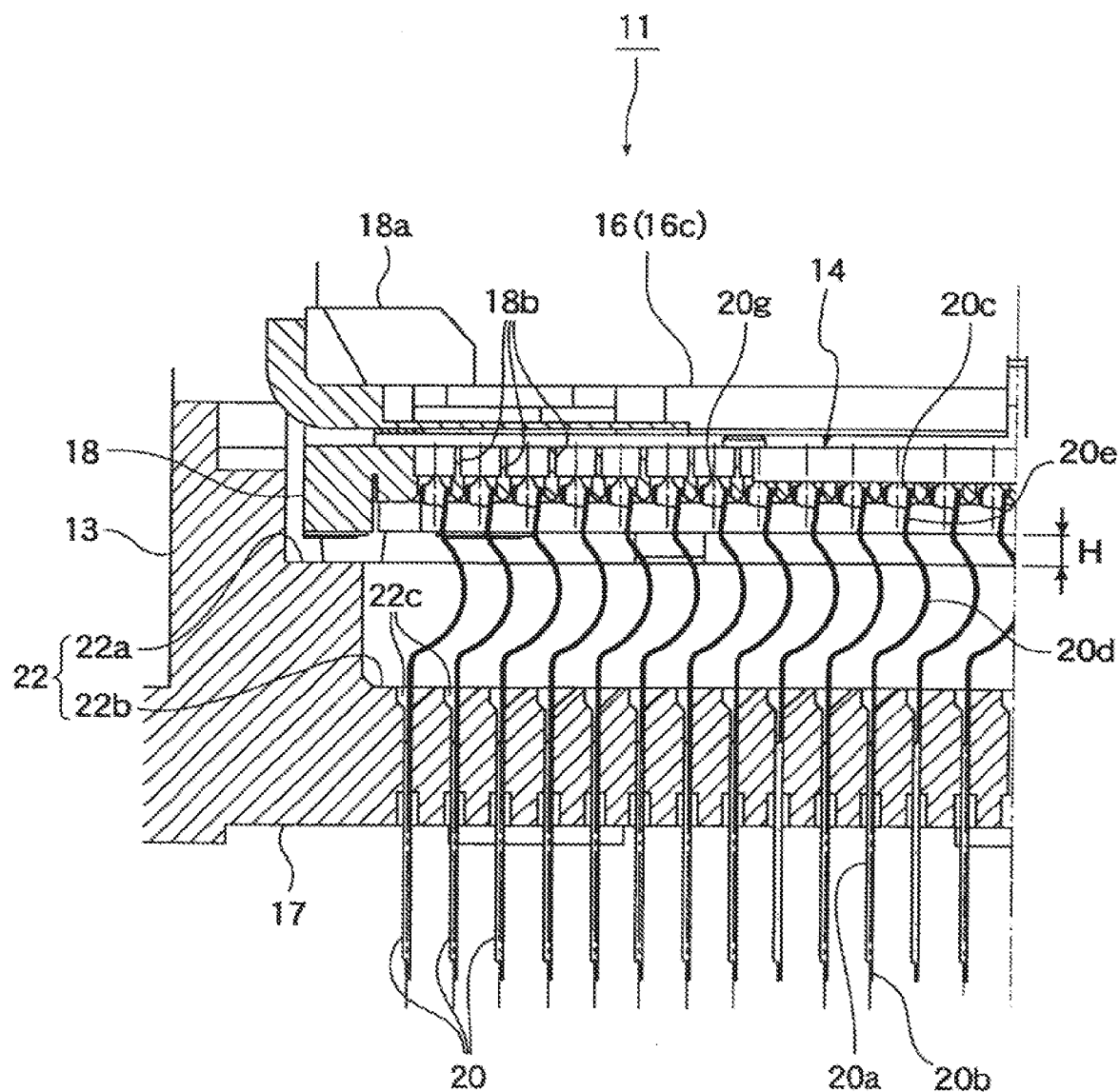
FIG. 5 is an enlarged view showing the V-part in FIG. 3, according to embodiment 1.

To be more specific, socket body 13 has virtually-square base member 17, floating plate 18 and contact pins 20 to constitute the main part of socket 13. As shown in FIG. 5, square concave portion 22 is formed in a center portion of base member 17. Concave portion 22 is a two-step concave portion, having plate accommodating step 22a to accommodate floating plate 18 and pin accommodating step 22b smaller than that.

Figure 1:
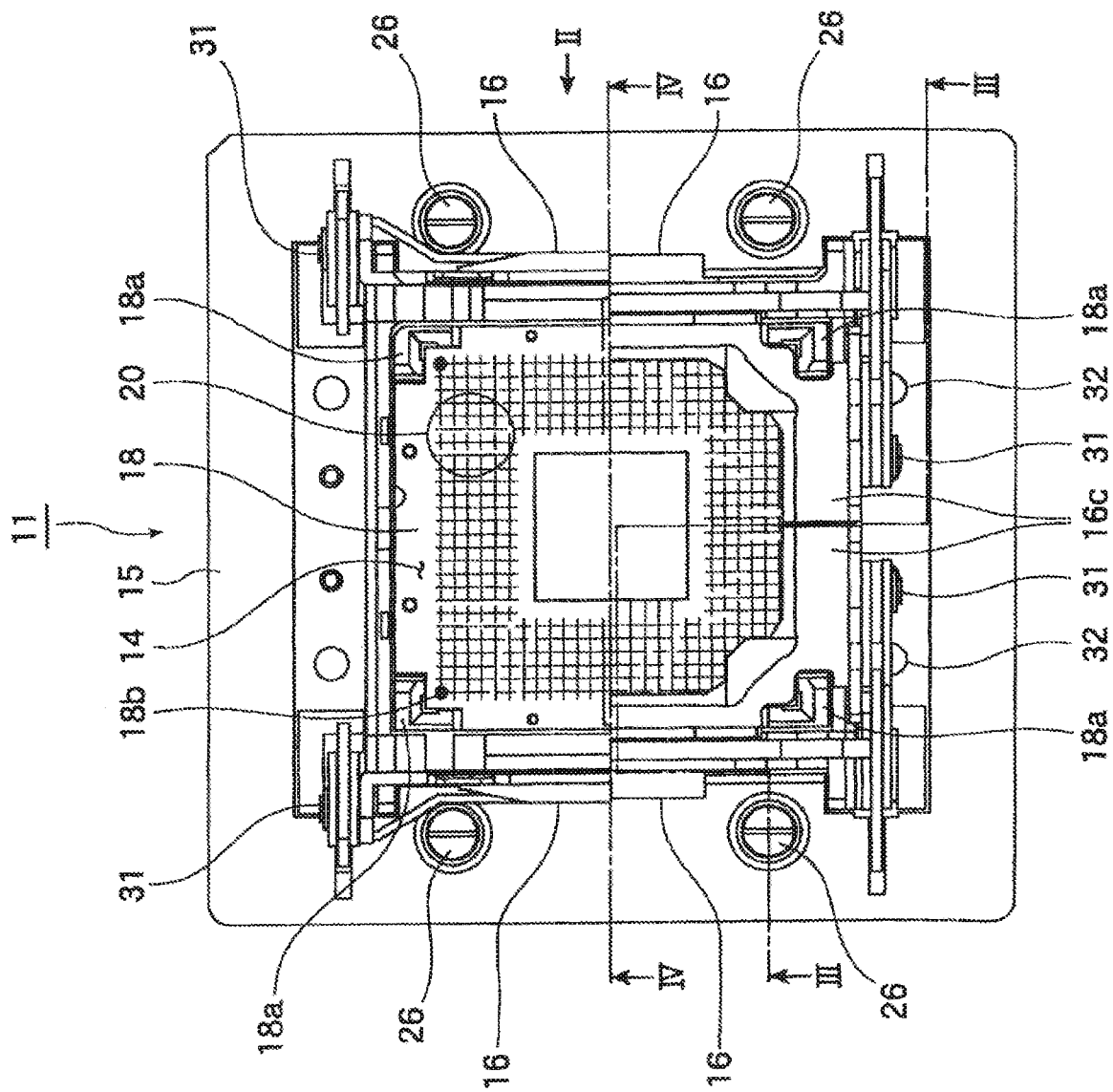
FIG. 1 is a plan view showing an IC socket according to embodiment 1 of the present invention.
Figure 4:
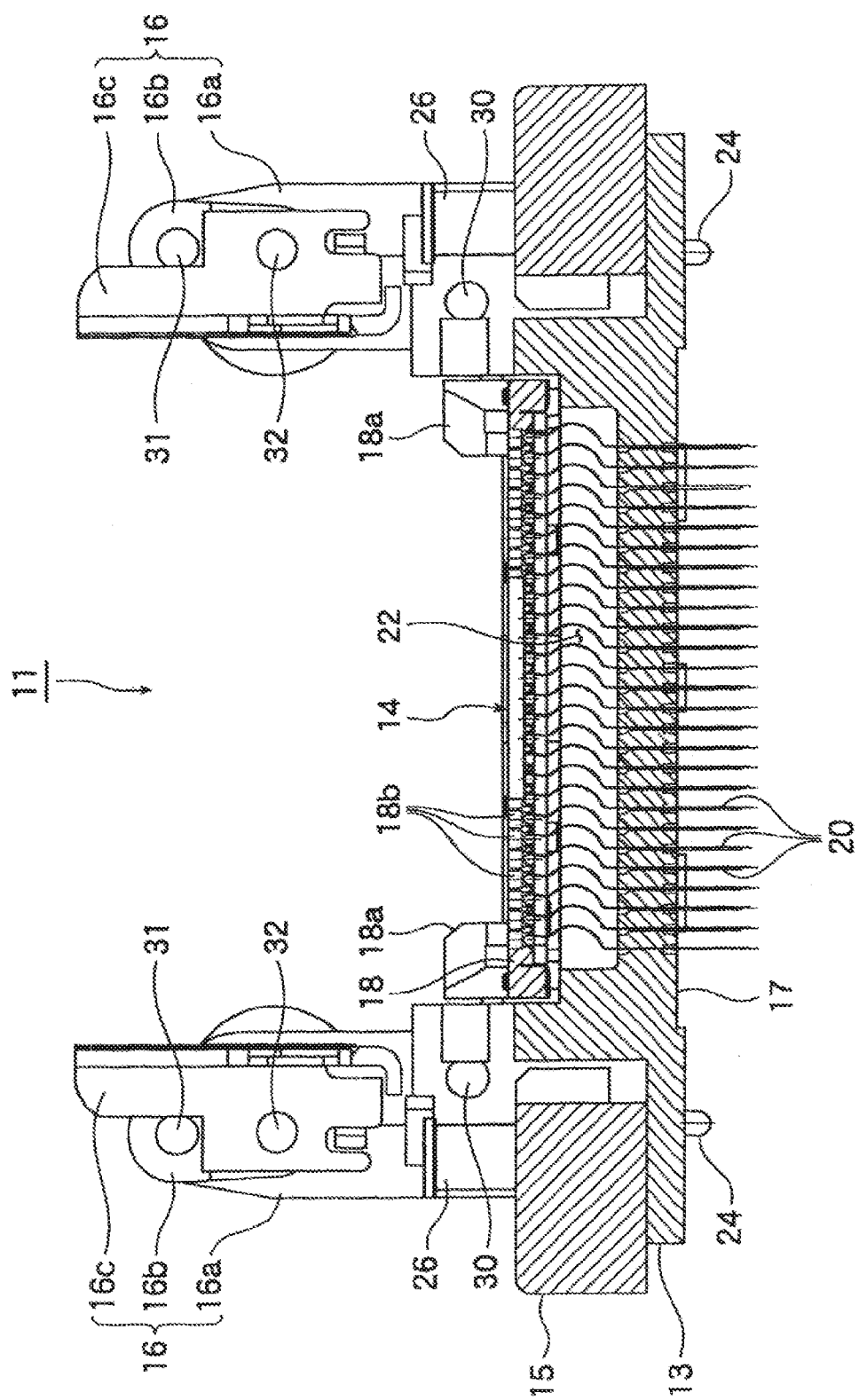
FIG. 4 is a vertical cross-sectional view showing a state in which the pressing members of an IC socket according to embodiment 1 assume disengaged positions.

As shown in FIG. 1, FIG. 4 and FIG. 5, floating plate 18 has a square shape. In its four corner portions, guide parts 18a for guiding the corner portions of IC package 12, are provided with an upward orientation. Four guide parts 18a and the upper surface of floating plate 18, form accommodating part 14 described above. Accommodating part 14 accommodates IC package 12.

As shown in FIG. 5, floating plate 18 is provided in plate accommodating step 22a of base member 17, to be able to move upward and downward, is mildly biased upward by a spring (mot shown). Furthermore, in floating plate 18, many through-holes, in which contact pins 20 are inserted, are formed. These through-holes 18b are formed in a sufficient size to accommodate solder balls 12b, to meet the locations of solder balls 12b in IC package 12.

In the bottom surface of concave portion 22 of base member 17, many press-fit holes 22c (see FIG. 5) are formed in association with through-holes 18b of floating plate 18. Contacts pin 20 are press-fit from above into these press-fit holes 22c. Contact pins 20 are disposed at narrow pitches, over base member 17 and floating plate 18.

Figure 2:
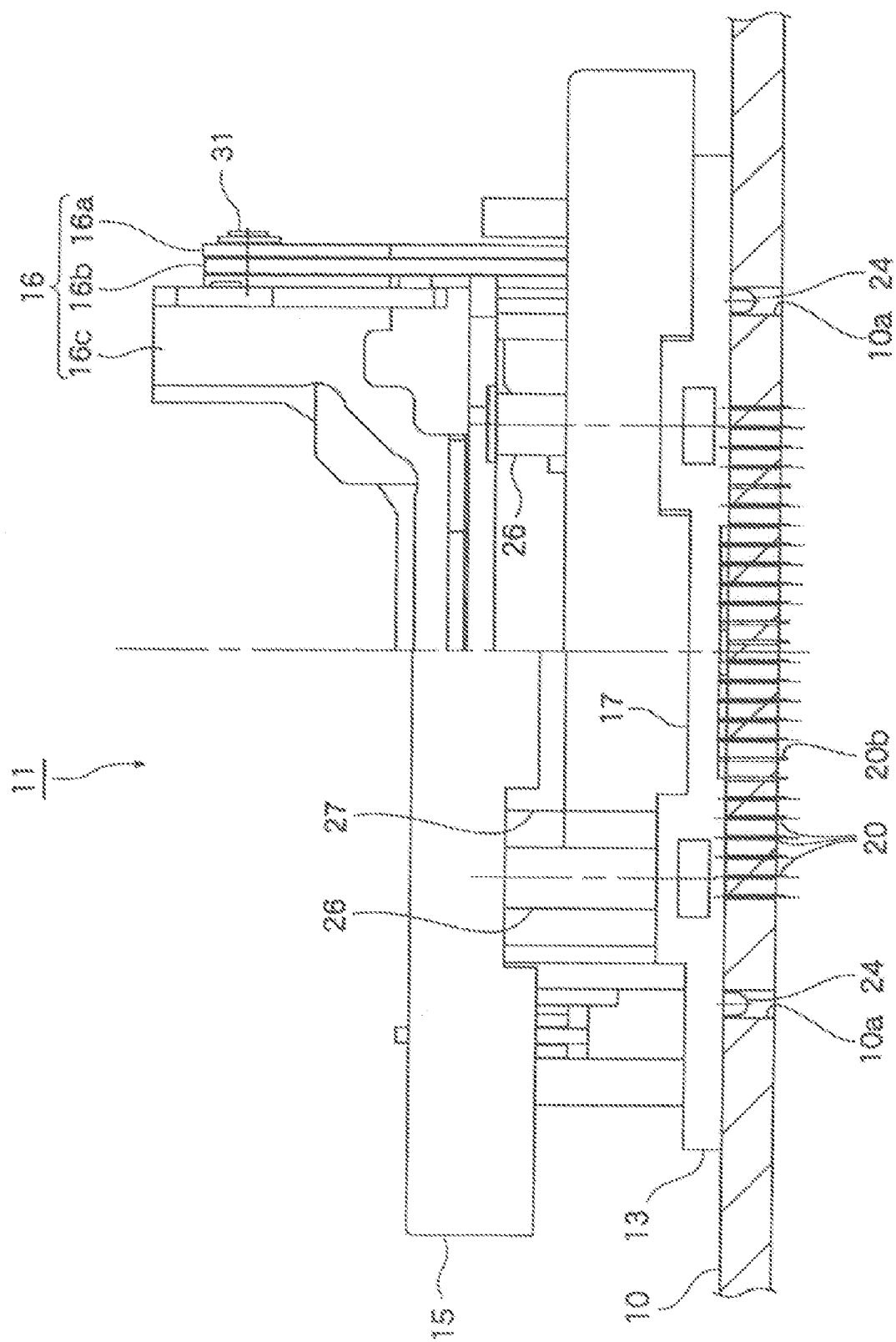
FIG. 2 is a side view showing an IC socket according to embodiment 1 from the II arrow-view in FIG. 1.

As shown in FIG. 2, on the lower surface of socket body 13 (base member 17), two positioning pins 24 are provided in diagonal directions. When these positioning pins fit in positioning holes 10a provided in printed wiring board 10, base member 17 is positioned accurately.

Figure 3:
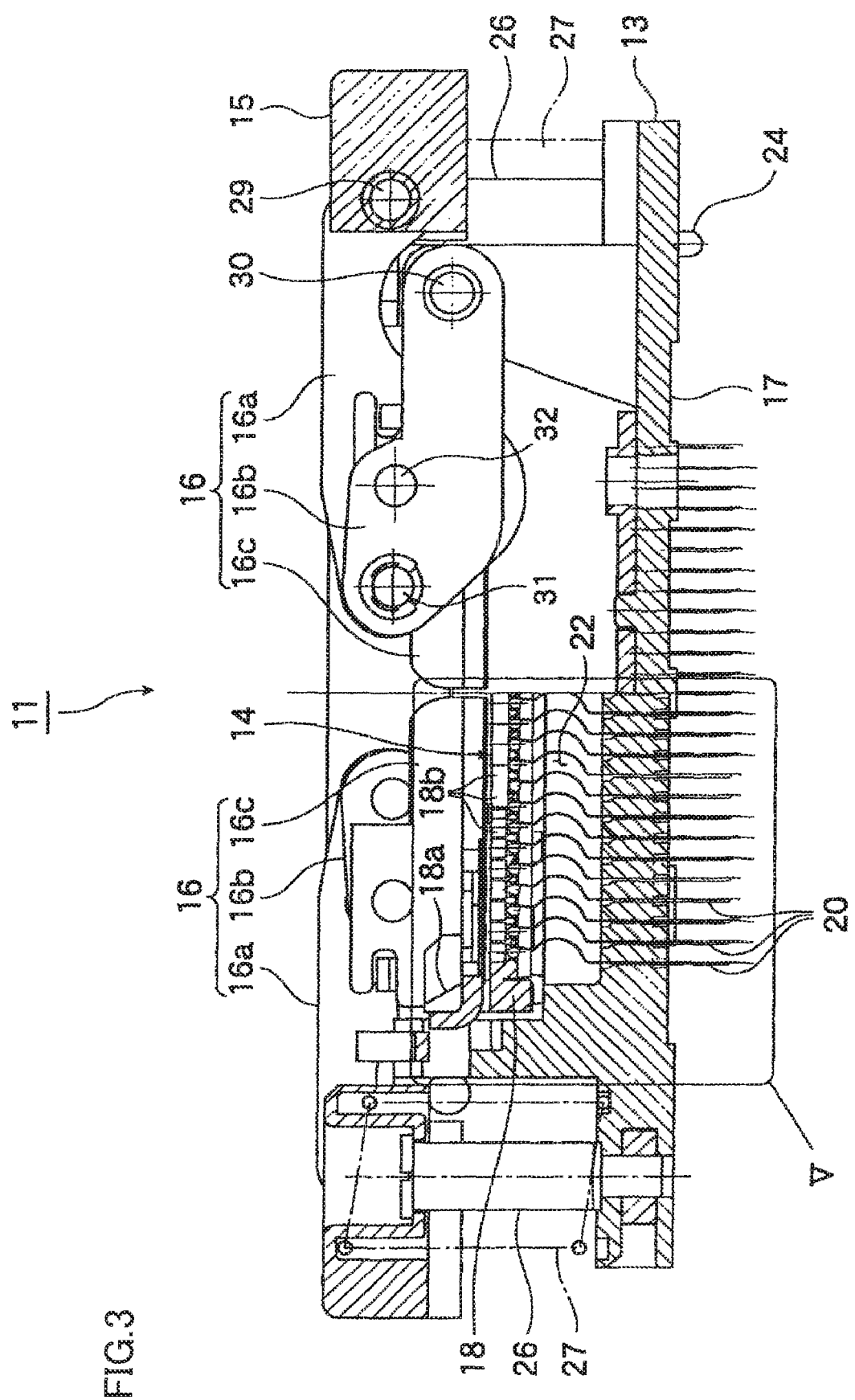
FIG. 3 is a vertical cross-sectional view showing an IC socket according to embodiment 1 along the III-III line in FIG. 1.

Operating member 15 is a virtually square frame member, and its outer shape is larger than socket body 13 (base member 17). As shown in FIG. 3, this operating member 15 is supported by four slide posts 26, which are erected in base member 17, to be movable upward and downward, and slides in predetermined strokes along the axial direction of slide posts 26 Operating member 15 is biased upward by springs 27 wound around slide posts 26.

Also, as shown in FIG. 2 to FIG. 4, pressing member 16 has, for example, a pair of left and right upper arms 16a, a pair of left and right lower arms 16b, and pressing body 16c. The base portion of each upper arm 16a is pivotally supported by upper rotating shaft 29 provided in operating member 29. The base portion of each lower arm 16b is pivotally supported by lower rotating shaft 30, provided in an inner and lower location in socket body 13 than upper rotating shaft 29. The free ends of each upper arm 16a and lower arm 16b are coupled mutually rotatably by front rotating shaft 31. Each pressing plate 16c is connected with lower arm 16b by connecting shaft 32.

Pressing members 16 are able to rotate between "disengaged positions" in which pressing members 16 are both open upward like double doors (the upper half of FIG. 1, the right half of FIG. 2, and the state shown in FIG. 4), and "pressing positions" in which pressing members 16 are rotated downward and closed (the lower half of FIG. 1, the left half of FIG. 2, and the state shown in FIG. 3).

The operations of pressing member 16 will be described below with reference to FIG. 3. When operating member 15 is depressed, the location of upper rotating shaft 29 goes down. Accompanying this, upper arm 16a rotates upward about upper rotating shaft 29. This movement transmits through front rotating shaft 31 and lifts the upper end of lower arm 16b upward. As a result of this, lower arm 16b and pressing body 16c rotate upward, and the whole of pressing member 16 rotates to the disengaged position. By contrast, when operating member 15 is released, operating member 15 rises upward by the bias by spring 27. Upper arm 16a, lower arm 16b and pressing body 16c rotate downward. As a result of this, the whole of pressing member 16 rotates to the pressing position.

By the way, contact pins 20 are formed by stamping a metal plate material having good electrical conductivity, and are provided at narrow pitches inserted through base member 17 and floating plate 18. As shown in FIG. 6 to FIG. 9, each single contact pin 20 has press-fit part 20a, lower contact part 20b, upper contact part 20c, curved-spring part 20d and linear part 20e, as showing in FIG. 6 to FIG. 9. Press-fit part 20a is formed linear. Lower contact part 20b is formed by narrowing the lower end of press-fit part 20a. Upper contact part 20c is located in the uppermost portion of contact pin 20 and contacts solder balls 12b of IC package 12. Curved-spring part 20d is located between upper contact part 20c and lower contact part 20b and is formed to curve in a shallow arc shape. Linear part 20e is formed linear and connects between the upper end of curved-spring part 20d and upper contact part 20c.

The shape of the horizontal cross-sectional shape of press-fit part 20a assumes a shallow U-shape. Right above press-fit part 20a, a slightly wider stopper piece 20f is formed. Press-fit part 20a is press-fit in press-fit hole 22c of base member 17 from above, until stopper piece 20f hits the bottom surface concave portion 22. Then, as shown in FIG. 2, lower contact part 20b projects underneath the bottom surface of base member 17. Lower contact part 20b is inserted through a through-hole (not shown) of a contact point provided on printed wiring board 10, and soldered from below printed wiring board 10. As a result of this, lower contract part 20b electrically conducts with the contract point in printed wiring board 10.

Curved-spring part 20d is obtained by bending an upper segment of contact pint 20 so as to gain certain elasticity. When pressing force is applied to contact pin 20, in its axial direction, curved spring part 20d is deformed elastically into a state to make the bend radius smaller, makes the entire length of contact pin 20 shorter, and at the same time produces reaction force to extend contact pin upward. According to the present embodiment, curved-spring parts 20d of many contact pins 20 are accommodated inside pin accommodating step 22b in base member 17 to face the same direction uniformly.

Upper contact part 20c is formed by, for example, forming the upper end portion of linear part 20e in a T-shape and curling its horizontal side parts to form a (virtually cylindrical) crown shape. In this cylindrical upper end portion, a pair of contact projections 20g that project upward a little, are formed to face each other horizontally. The shape of upper contact part 20c might assume other shapes. However, it is preferable to provide upper contact part 20c with two or more contact projections 20g, so that these contact projections 20g contact locations apart from the tips (center parts) of solder balls 12b in IC package 12. Then, each upper contact part 20c is inserted in through-hole 18b of floating plate 18.

Next, a case will be described where IC package 12 is tested.

First, positioning pins 24 of socket body 13 (base member 17) are fit in positioning holes 10a in printed wiring board 10a. At the same time, lower contact part 20b of each contact pin 20 projecting out from the lower surface of socket body 13, is inserted in a through-hole in printed wiring board 10 and soldered. By this means, a plurality of IC sockets are arranged on printed wiring board 10.

Then, in each IC socket 11, as shown in FIG. 3 and FIG. 5, operating members 15 rise upward by the bias of springs 27, and pressing members 16 are placed in pressing positions. Furthermore, since IC package 12 is not accommodated in accommodating part 14, floating plate 18 rises upward inside plate accommodating step 22a of base member 17 by the bias of springs (not shown). As a result of this, gap H is created with respect to the bottom surface of plate accommodating step 22a.

Upper contact part 20c (contact projection 20g) of each contact pin 20 is then sunk in through-hole 18b in floating plate 18 and does not project out beyond the upper surface of floating plate 18.

Then, IC package 12 is set in this IC socket 11, using, for example, an automatic device as follows, and electrically connected.

That is to say, in the state automatic device (not shown) holds IC package 12, as shown in FIG. 4, operating members 15 are pressed downward and go down against the bias of springs 27. In accordance with this, pressing members 16 rotate and open up like double doors, from the pressing positions shown in FIG. 3, to the disengaged positions shown in FIG. 4. This allows accommodating part 14 to accommodate IC package 12.

In this state, the automatic device releases IC package 12 and accommodates it in accommodating part 14. In this case, IC package 12 is positioned in a predetermined location by guide part 18a of floating plate 18. Consequently, solder balls 12b of IC package 12 match the locations of through-holes 18b of floating plate 18 and contact upper contact parts 20c (contact projection 20g) of contact pins 20 accurately.

Figure 10:
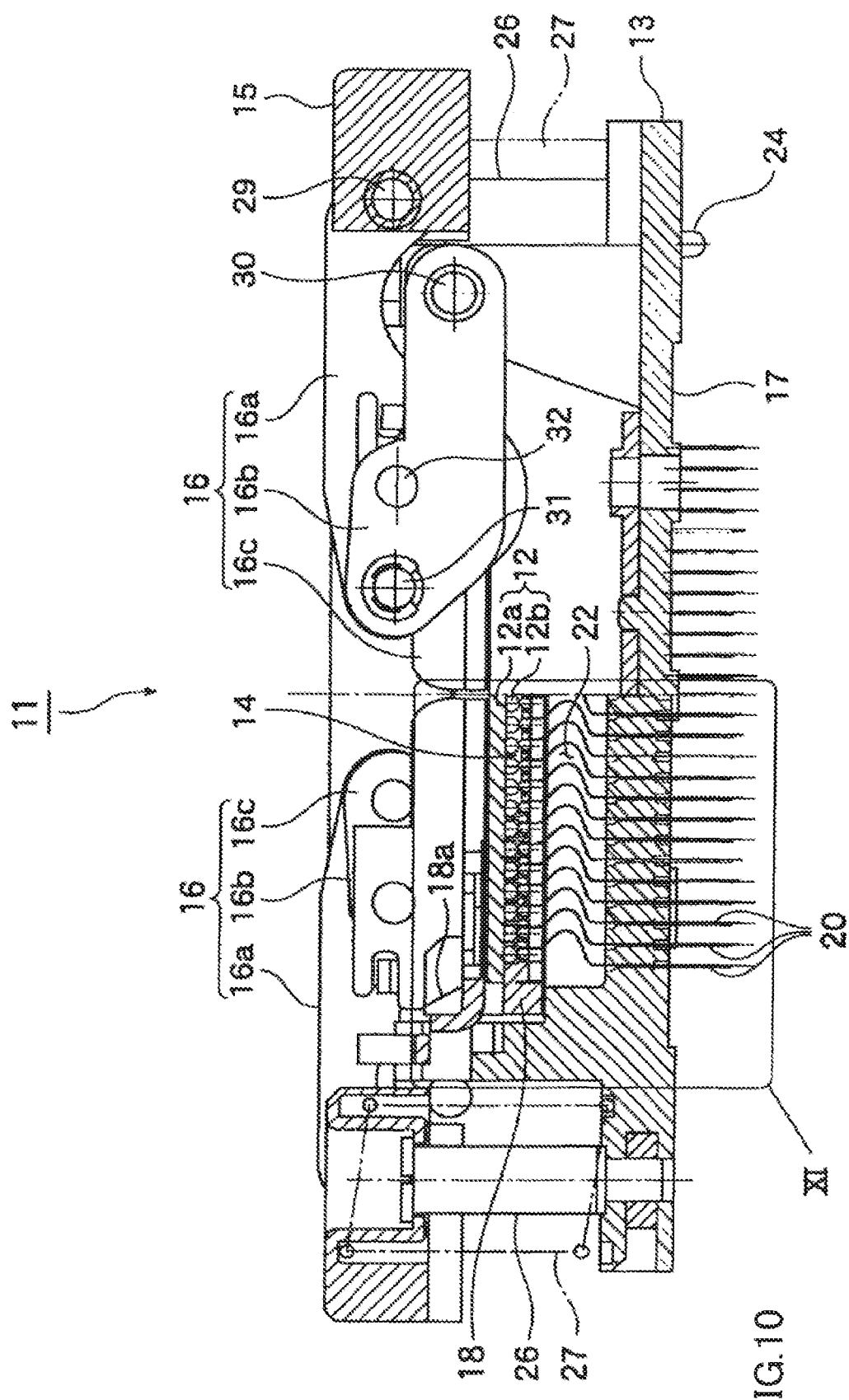
FIG. 10 is a vertical cross-sectional view showing an IC socket according to embodiment 1 applying pressure.
Figure 11:
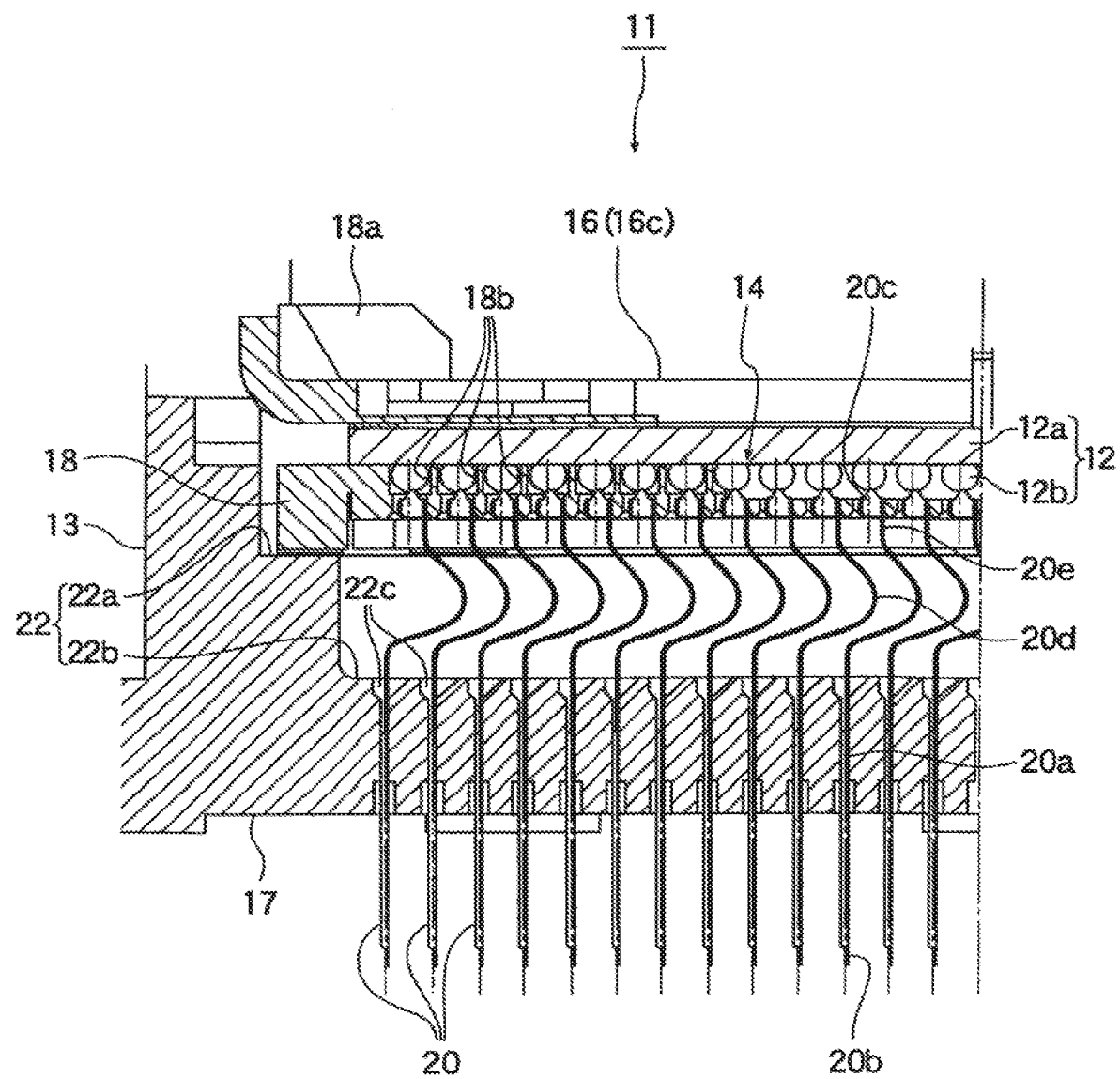
FIG. 11 is an enlarged view of the XI-part shown in FIG. 10, according to embodiment 1.

Following this, when the automatic device turns off the pressing force of operating members 15, operating members 15 rise upward by the bias of springs 27, and pressing members 16 rotate from disengaged positions to the pressing positions shown in FIG. 10 and FIG. 11. By this means, the edge portions of IC package 12 are pressed by pressing bodies 16c from above. Furthermore, IC package 12 goes down inside plate accommodating step 22a of base member 17 with floating plate 18. Then, floating plate 18 hits the bottom surface of plate accommodating step 22a. That is, IC package 12 and floating plate 18 go down for the size of gap H shown in FIG. 5.

Then, as shown in FIG. 10, FIG. 11 FIG. 12(a) and FIG. 12(b), upper contact part 20c (contact projection 20g) in the upper end of each contact pin 20 touches solder ball 12b in IC package 12. Also, curved-spring part 20d of each contact pin 20 is elastically deformed in a direction its bend radius becomes smaller. By this elasticity, upper contact part 20c (contact projection 20g) is pressed against solder ball 12b. By this means, solder balls 12b of IC package 12 electrically conduct with printed wiring board 10 via contact pins 20, so that a burn-in test of IC package 12 can be conducted.

Upper contact part 20c of each contact pin 20 is formed in a crown shape, and, in its upper end, a pair contact projections 20g are provided facing each other horizontally. These contact projections 20g bite into the surrounding portions a little, except for the tip (lower end) of spherical solder ball 12b. The tip of solder ball 12b is not damaged, so that the quality of IC package 12 can be maintained good.

Figures 12A, 12B:
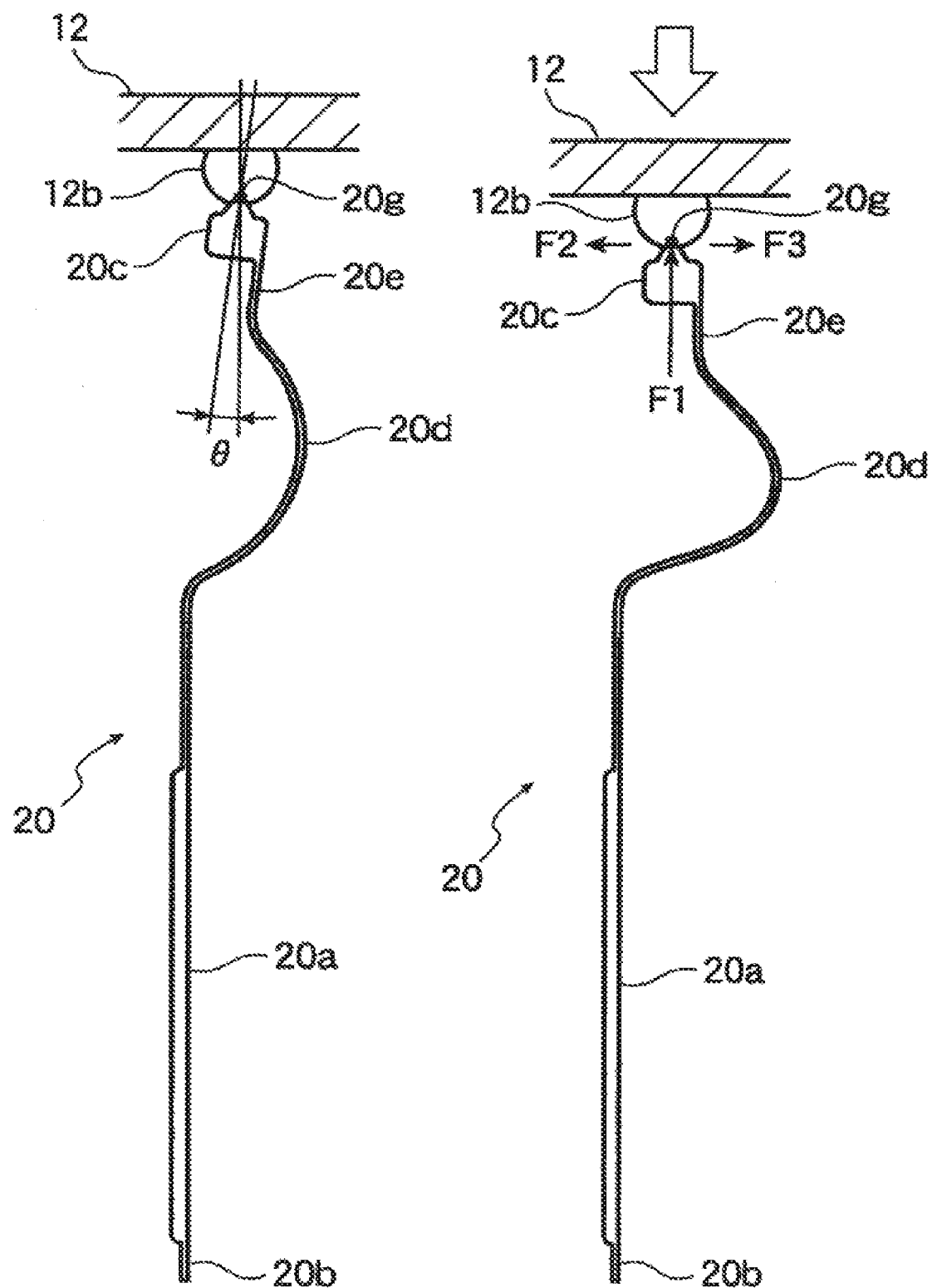
FIG. 12(*a*) and FIG. 12(*b*) show side views of a contact pin according to embodiment 1, where FIG. 12(*a*) shows a state where pressure is not applied and FIG. 12(*b*) shows a state where pressure is applied.

Upon press by pressing members 16, between the state of FIG. 12(a) in which upper contact part 20c (contact projection 20g) of each contact pin 20 starts contacting solder ball 12b of IC package 12, and the state of FIG. 12(b) in which the press is finished, the automatic device rotates the upper contact part 20c side about contact projection 20g, which is the contact point between upper contact pact 20c and solder ball 12b. Each contact pin 20 is formed in such a shape that the location of contact projection 20g with respect to solder balls 12b does not change at this time.

Figure 6:
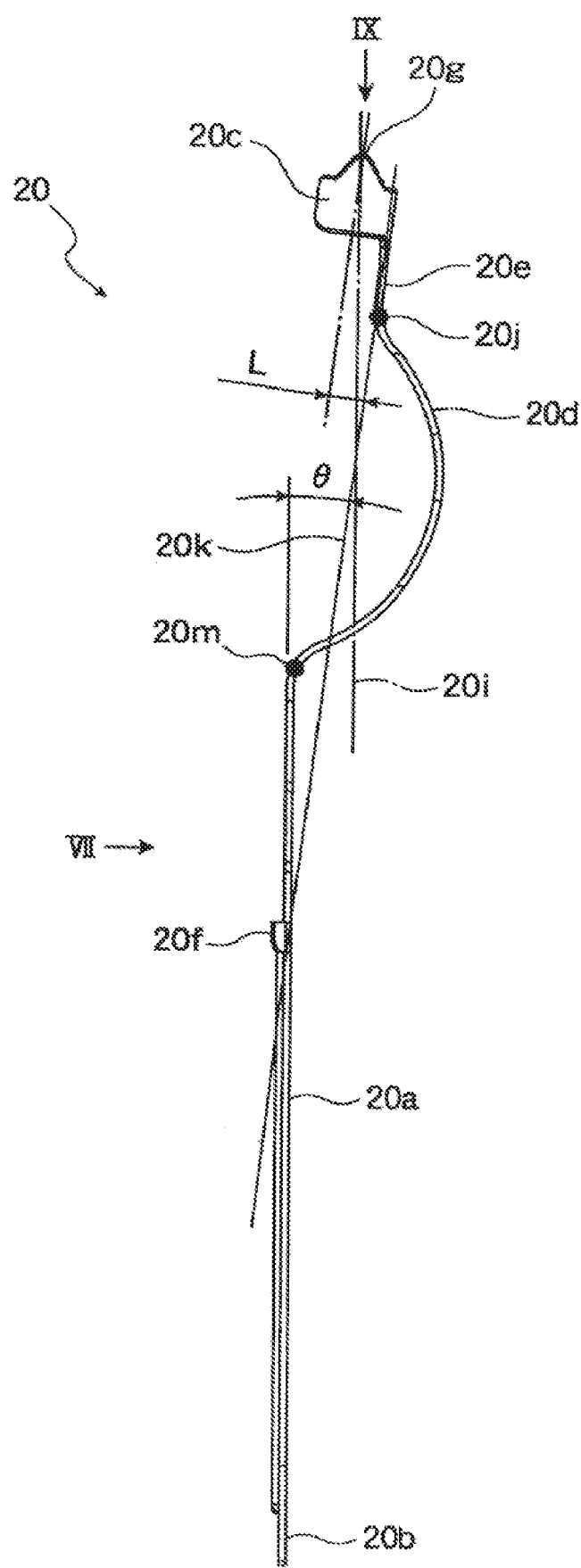
FIG. 6 is a side view of a single contact pin according to according to embodiment 1.
Figure 7:
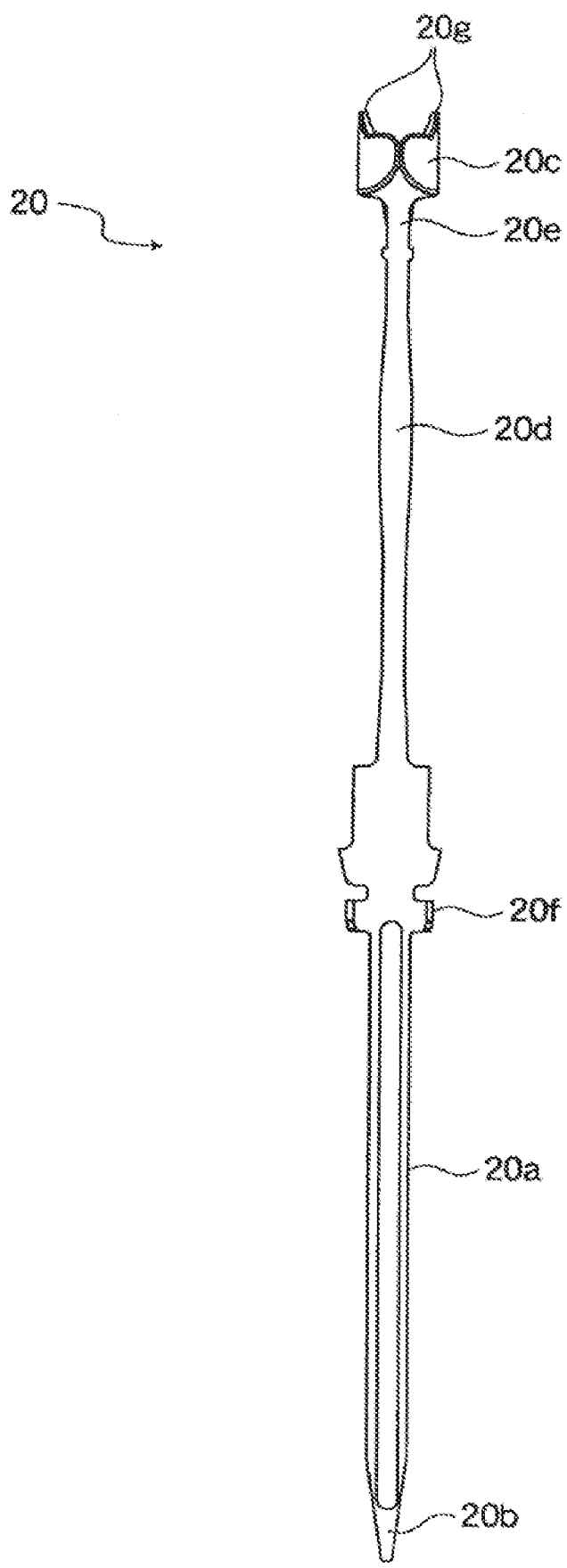
FIG. 7 is a front view of a single contact pin according to embodiment 1.
Figure 8:
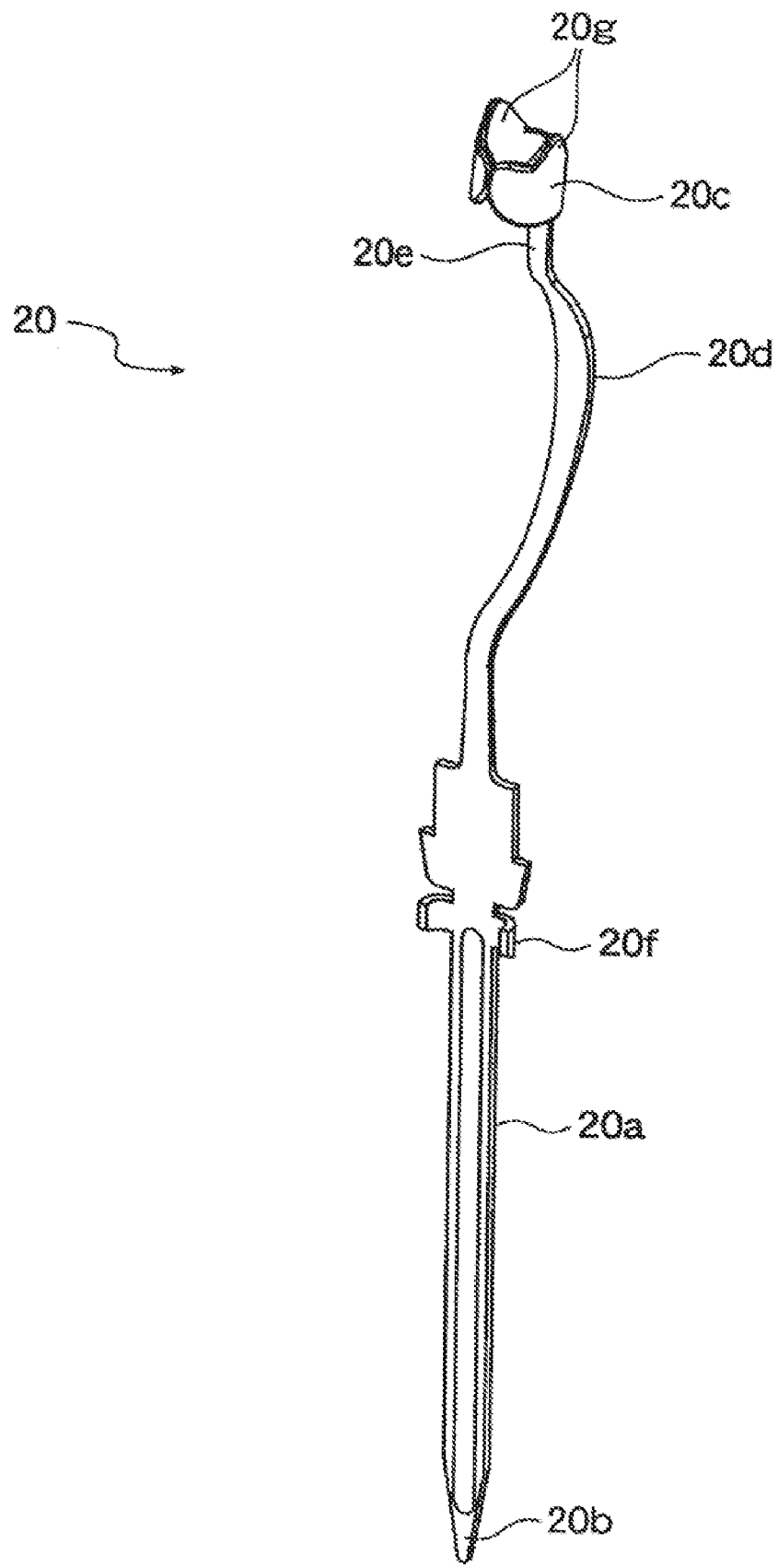
FIG. 8 is a perspective view showing a single contact pin according to embodiment 1.
Figure 9:
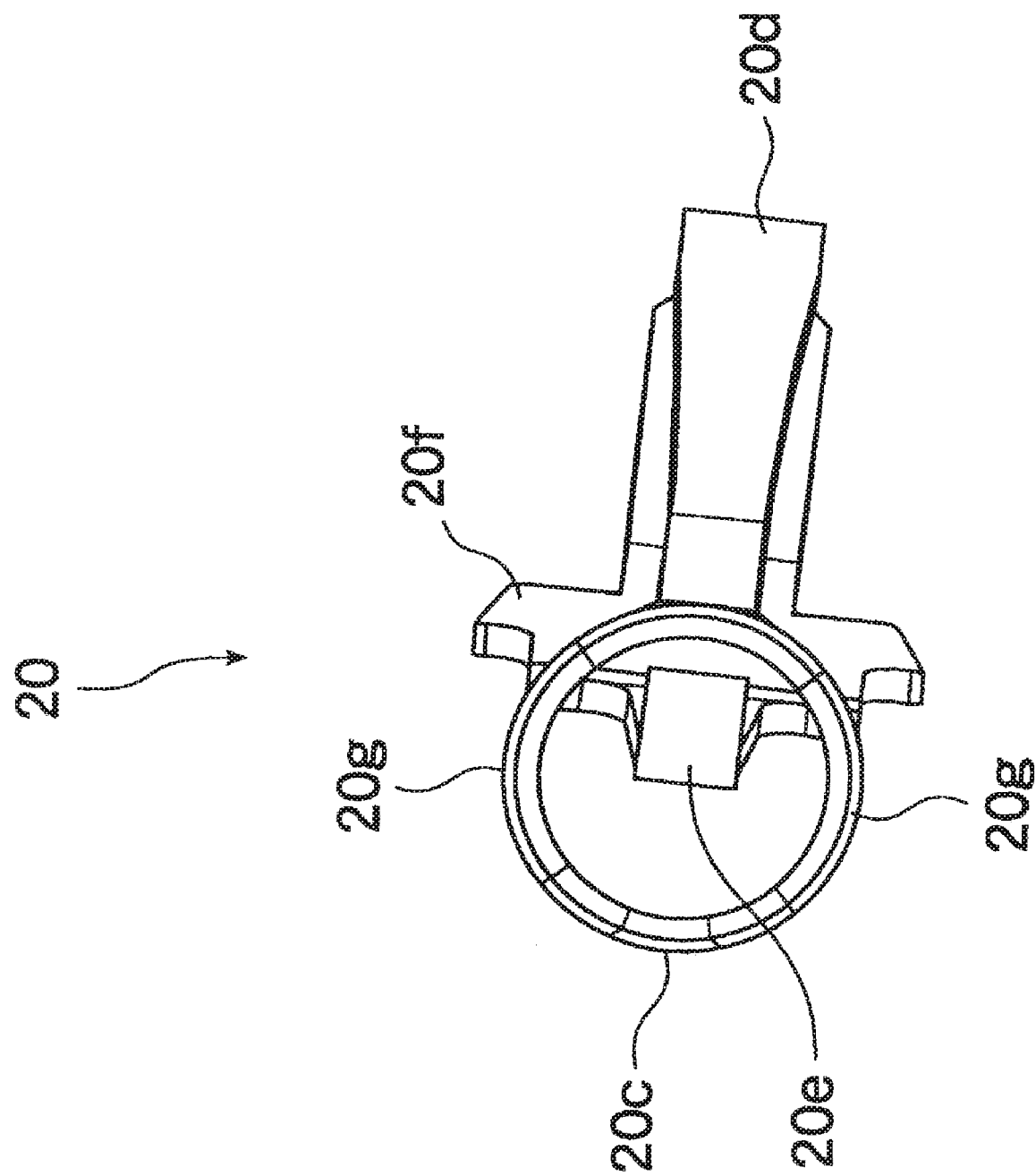
FIG. 9 is a plan view showing a single contact pin according to embodiment 1, from the IX arrow view in FIG. 6.

To be more specific, as shown in FIG. 6 and FIG. 12(a), linear part 20e of each contact pint 20 tilts in the direction the curve of curved-spring part 20d expands when not pressed. Furthermore, upper contact part 20c is provided in the opposite upper end to the tilt direction of linear part 20e. That is to say, curved-spring part 20d expands to the right in the drawings. Linear part 20e tilts at tilt angle θ to the right, which is the direction of the expansion of curved-spring part 20d. Upper contact part 20c is provided in an upper left side of linear part 20e.

When pressure is not applied, contact projection 20g of upper contact part 20c is located with an offset of dimension L with respect to linear part 20e, in the opposite direction (to the right in FIG. 6) to the direction of the expansion of curved-spring part 20d, from a side view. The scale of this offset dimension L, the scale of tilt angle θ of linear part 20e, and the length of linear part 20e are preferably set such that, in a side view, vertical line 20i that passes contact projection 20g passes the side in which upper contact part 20c is offset (the left side), rather than border point 20j of curved spring part 20d and linear part 20e.

Tilt angle θ is set such that, for example, extending line 20k that extends linear part 20e downward, crosses press-fit part 20a below border point 20m of curved spring part 20d and press-fit part 20a.

Furthermore, when pressure is applied (see FIG. 12(b)), the shape of the curve and elasticity modulus of curved-spring part 20g, the length and tilt angle θ of linear part 20e, and offset dimension L of contact projection 20g are set such that linear part 20e runs along the vertical direction, that is, linear part 20e becomes vertical with respect to IC package 20e. At this time, these values are set such that vector F1 of the force contact projection 20g presses solder ball 12b of IC package 12 upward becomes vertical with respect to solder balls 12b from a side view, and vectors of component forces F2 and F3 that try to press contact projection 20g laterally are not produced.

Whether pressure applied or not applied, upper contact part 20c and linear part 20e are preferably set not to interfere with through-holes 18b of floating plate 18.

With IC socket 11 configured this way, when pressing members 16 press against IC package 12, after upper contact part 20c of each contact pin 20 starts contacting solder balls 12b, contract projection 20g in upper contact part 20c does not slip on the surface of spherical solder balls 12b and change its location, until the press is finished. By this means, it is possible to prevent contact projection 20g from producing wiping and prevent solder from adhering to contact projection 20g.

In particular, with each contact pin 20, linear part 20e is provided that extends upward from the upper end of curved-spring part 20d, which curves in a shape resembling the letter C, and connects with upper contact part 20c, and this linear part 20e is made to tilt in the direction of the expansion of curved-spring part 20d. Meanwhile, upper contact part 20c is provided in the opposite direction to the tilt direction of linear part 20e, and this upper contact part 20c places the location of contact projection 20g to contact solder balls 12b in IC package 12 with an offset in the opposite direction to the direction of expansion of curved spring part 20d with respect to the axial direction of linear part 20e. By this means, wiping can be prevented by a very simple configuration.

In addition, each contact pin 20 is furthermore formed such that, when pressing members 16 finish pressing IC package 12, linear part 20e runs along the vertical direction. By this means, when pressing members 16 finish pressing, contact projection 20g is pressed against solder balls 12b vertically, thereby preventing wiping in the most effective manner.

Assuming a side view of contact pin 20 to which pressure is not applied, the length and tilt angle θ of linear part 20e, and the scale of the dimension of offset dimension L of contact projection 20g are set such that vertical line that passes contact projection 20g passes the side in which upper contact part 20c is offset, rather than border point 20j of curved spring part 20d and linear part 20e, contributing to effective prevention of wiping.

FIG. 13(a) and FIG. 13(b) are vertical cross-sectional views showing the positional relationships of contact pins 20 and floating plate 18, where FIG. 13(a) shows an embodiment of the present invention and FIG. 13(b) shows another embodiment of the present invention. In FIG. 13(a) and FIG. 13(b), the configurations of the components are the same as in FIG. 5 and FIG. 11, so that these components are assigned the reference codes and are not explained.

Solder balls 12b of IC package 12 are formed with solder, and, even if wiping does not occur with contact projection 20g of each contact pin 20 that repeats contacting these solder balls 12b, there is a likelihood that solder keeps adhering little by little and eventually increases the electrical resistance. Consequently, one possible idea is to remove the materials to adhere to contact projection 20g such as solder, by placing accommodating part 14 of IC socket 11 (the upper surface of floating plate 18) to touch a cleaning sheet having predetermined surface roughness, instead of placing IC package 12.

By this means, as shown in FIG. 13(a), contact projection 20g of each contact pin 20 is sunk lower than the upper surface of floating plate 18 even when pressure is applied, and the lower surface of cleaning sheet 33 is flat and does not have solder balls 12b that project downward like in IC package 12. Consequently, even if cleaning sheets 33 are provided on the upper surface of floating plate 18 and pressure is applied, contact projection 20g of each contact pin 20 cannot contact the lower surface of cleaning sheet 33 to remove the adhering materials.

By this means, as shown in FIG. 13(b), the area in the upper surface of floating plate 18 where through-holes 19b, in which contact pins 20 are inserted, are disposed, is reduced by dimension D, and contact projection 20g of each contact 20 pin projects out a little from the upper surface of floating plate 18 when pressure is applied.

Thus, by placing cleaning sheet 33 on the upper surface of floating plate 18 and pressing by pressing member 16, it is possible to make contact projection 20g of each contact pin 20 touch cleaning sheet 33 and remove the materials adhering to contact projection 20g such as solder effectively. As stated earlier, after contact projection 20g starts touching cleaning sheet 33, each contact pin 20 rotates the upper contact part 20c side about contact projection 20g until the pressure is no longer applied, so that it is possible to press contact projection 20g against cleaning sheet 33 effectively and remove the adhering materials.

The dimension D to go lower is set such that contact projection 20g of each contact pin 20 goes below the upper surface of floating plate 18 when pressure is not applied and contact projection 20g projects out beyond the upper surface of floating plate 18 only when pressure is applied, so that it is possible to prevent contact pins 20 from being damaged by touching other objects when IC package 12 is not mounted.

Figure 14A:
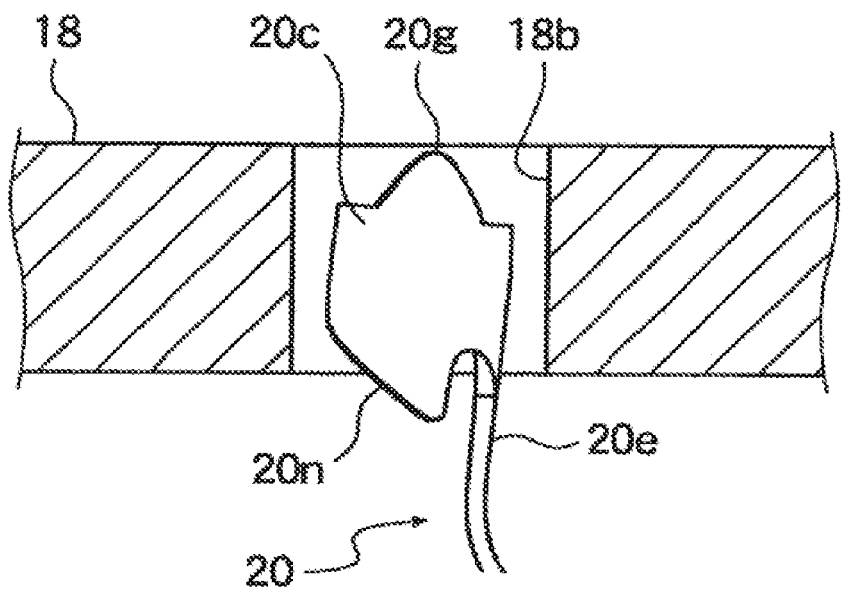
FIG. 14(a) and FIG. 14(b) are side views showing a contact pin according to yet another embodiment of the present invention, where
Figure 14B:
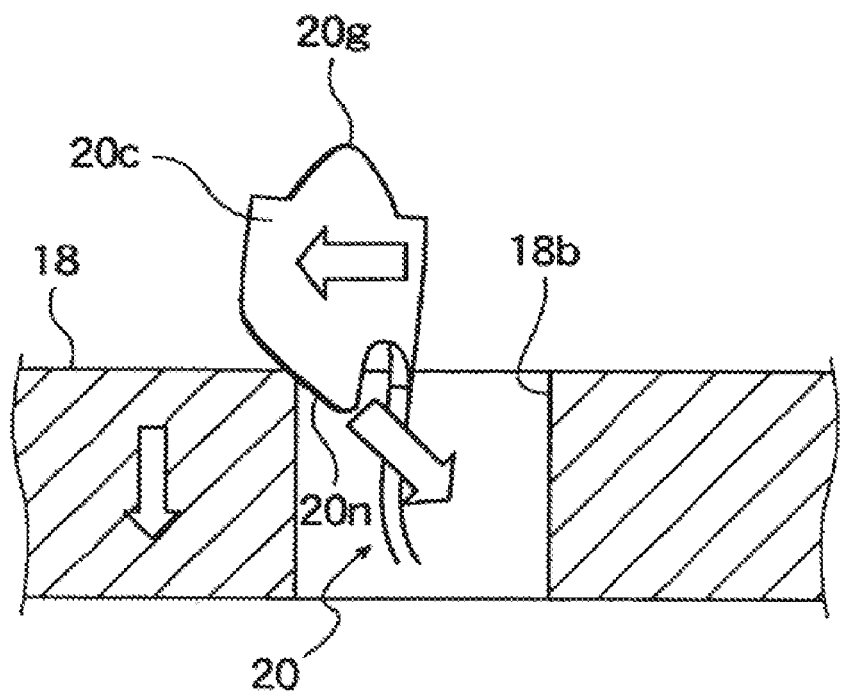

FIG. 14(a) and FIG. 14(b) are side views of contact pin 20 according to yet another embodiment of the present invention. In FIG. 14(a) and FIG. 14(b), in the lower edge of upper contact part 20c of contact pint 20, tilt part 20n that extends downward obliquely toward linear part 20e is formed. The length of tilt part 20n, as shown in FIG. 14(b), when floating plate 18 goes down such that tilt part 20n does not completely fall off through-hole 18b of floating plate 18. Furthermore, the tilt angle of the lower side of tilt part 20n is preferably made a steeper angle than 45 degrees.

When electric components such as IC packages are not mounted in floating plate 18, even if floating plate 18 is depressed by a pressure member (not shown), upper contact part 20c does not project out of through-hole 18b, and, if floating plate 18 raised upward from this state, the tilt cam effect produced by tilt part 20n of upper contact part 20c allows upper contact part 20c to return in through-hole 18b smoothly, as shown in FIG. 14(b).

By this means, with the rise of floating plate 18, the jaw part of upper contact part 20c does not hook on the edge of through-holes 18b, so that the upward and downward movement of floating plate 18 is kept smooth and damage to contact pin 20 can be prevented.

INDUSTRIAL APPLICABILITY

The electric component socket according to the present invention can be used for a performance test of an electric component such as an IC package.

REFERENCE SIGNS LIST

1 Printed wiring board (substrate)
11 IC socket (electric component socket)
12 IC package (electric component)
12b Terminal of electric component
13 Socket body
14 Accommodating part
15 Operating member
16 Pressing member
16a Disengaged position
16b Pressing position
17 Base member
18 Floating plate
20 Contact pin
20a Press-fit part
20b Lower contact part
20c Upper contact part
20d Curved-spring part
20e Linear part
20g Contact projection (contact point)
20i Vertical line that passes contact point
20j Border between curved-spring part and linear part
20k Extension of linear part
L Offset dimension

The invention claimed is:

1. A socket for an electric component comprising:
a socket body having an accommodating part that accommodates the electric component;
a pressing member that presses the electric component accommodated in the accommodating part toward a substrate when the socket body is mounted on the substrate; and
a plurality of contact pins that are incorporated inside the socket body and that make the electric component electrically conduct with the substrate when the pressing member presses the electric component, wherein:
the contact pins each comprise:
a lower contact part that is electrically conductive with a contact point of the substrate;
an upper contact part that contacts an upper terminal of the electric component upon the press; and
a curved-spring part that is located between the lower contact part and the upper contact part, that is elastically deformed upon the press, and that, by its elasticity, presses the upper contact part against the terminal of the electric component; and
the contact pins are each formed in such a shape that, upon the press, after the upper contact part starts contacting the terminal of the electric component, an upper contact part side rotates about a contact point of the upper contact part with a terminal of the electric component, until the press is finished, and a location of the contact point with the terminal of the electric component does not change.

2. The socket for the electric component according to claim 1, wherein:
the contact pins each further have a linear part that extends upward from an upper end of the curved-spring part that curves in the shape resembling the letter C, and connects with the upper contact part;
the linear part tilts toward a direction in which the curved-spring part expands;
the upper contact part is provided opposite the tilt direction of the linear part of the upper contact part; and
the location of the contact point where the upper contact part contacts the terminal of the electric component is placed with an offset in an opposite direction to the direction of the expansion of the curved spring part with respect to an axial direction of the linear part.

3. The socket for the electric component according to claim 2, wherein the contact pins are each formed such that, when the pressing member finishes pressing against the electric component, the linear part runs along a vertical direction.

4. The socket for the electric component according to claim 2, wherein a length and tilt angle of the linear part and a scale of the offset are determined such that, from a side view of the contact pins when the pressure is applied, a vertical line passing the contact point passes a side in which the upper contact point is offset rather than a border point between the curved spring part and the linear part.

* * * * *